(12) United States Patent
Toukhy et al.

(10) Patent No.: US 7,255,970 B2
(45) Date of Patent: Aug. 14, 2007

(54) PHOTORESIST COMPOSITION FOR IMAGING THICK FILMS

(75) Inventors: Medhat A. Toukhy, Flemington, NJ (US); Ping-Hung Lu, Bridgewater, NJ (US); Salem K. Mullen, Hackettstown, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 11/179,364

(22) Filed: Jul. 12, 2005

(65) Prior Publication Data

US 2007/0015080 A1    Jan. 18, 2007

(51) Int. Cl.
G03F 7/004 (2006.01)
G03F 7/023 (2006.01)
G03F 7/30 (2006.01)

(52) U.S. Cl. ............ 430/191; 430/192; 430/193; 430/270.1; 430/326; 430/919; 430/921; 430/926

(58) Field of Classification Search ........ 430/191, 430/192, 193, 270.1, 326, 919, 921, 926
See application file for complete search history.

(56) References Cited

U.S. PATENT DOCUMENTS

| | | | | |
|---|---|---|---|---|
| 3,201,329 A | | 6/1885 | Whisler | 201/27 |
| 2,792,213 A | | 6/1957 | Moore et al. | 266/99 |
| 3,106,465 A | | 10/1963 | Nengebauer et al. | 430/193 |
| 3,130,047 A | | 4/1964 | Uhlig et al. | 430/193 |
| 3,148,983 A | | 9/1964 | Endermanne et al. | 430/492 |
| 3,785,825 A | | 1/1974 | Deutsch et al. | 430/165 |
| 3,802,885 A | | 4/1974 | Lawson et al. | 430/165 |
| 4,493,884 A | * | 1/1985 | Nagano et al. | 430/192 |
| 5,225,311 A | | 7/1993 | Nakano et al. | 430/190 |
| 5,273,856 A | * | 12/1993 | Lyons et al. | 430/191 |
| 5,322,765 A | * | 6/1994 | Clecak et al. | 430/326 |
| 5,338,818 A | * | 8/1994 | Brunsvold et al. | 528/43 |
| 5,556,734 A | * | 9/1996 | Yamachika et al. | 430/270.1 |
| 6,048,661 A | * | 4/2000 | Nishi et al. | 430/270.1 |
| 6,274,286 B1 | | 8/2001 | Hatakeyama et al. | 430/189 |
| 6,376,149 B1 | * | 4/2002 | Grober et al. | 430/139 |
| 6,627,377 B1 | | 9/2003 | Itatani et al. | 430/270.1 |
| 6,911,293 B2 | | 6/2005 | Wanat et al. | 430/191 |
| 6,991,888 B2 | | 1/2006 | Padmanaban et al. | 430/270.1 |
| 2003/0194636 A1 | | 10/2003 | Wanat et al. | 430/191 |
| 2003/0207202 A1 | | 11/2003 | Fujita et al. | 430/270.1 |
| 2004/0038148 A1 | | 2/2004 | Ohta et al. | 430/270.1 |
| 2004/0185368 A1 | | 9/2004 | Dammel et al. | 430/191 |
| 2004/0229155 A1 | | 11/2004 | Rahman et al. | 430/270.1 |
| 2004/0241591 A1 | | 12/2004 | Tomoi et al. | 430/322 |
| 2004/0265733 A1 | | 12/2004 | Houlihan et al. | 430/270.1 |
| 2005/0019705 A1 | | 1/2005 | Thackeray et al. | 430/326 |
| 2005/0271974 A1 | | 12/2005 | Rahman et al. | 430/270.1 |

FOREIGN PATENT DOCUMENTS

| | | |
|---|---|---|
| EP | 1 024 407 A1 | 8/2000 |
| EP | 1 435 544 A1 | 7/2004 |
| EP | 1 688 793 A1 | 8/2006 |
| WO | 03/085455 A1 | 10/2003 |

OTHER PUBLICATIONS

Solomon, Gary, "Electrochemically deposited solder bumps for wafer-level packaging", Solid State Technology, p.83, p. 84, and p, 88, Apr. 2001.

International Search Report (Form PCT/ISA/210) and Written Opinion of the International Searching Authority (Form PCT/ISA/237) for PCT/IB2006/001933.

* cited by examiner

*Primary Examiner*—John S. Chu
(74) *Attorney, Agent, or Firm*—Sangya Jain

(57) ABSTRACT

The present invention provides for a light-sensitive photoresist composition useful for imaging thick films, comprising a polymer which is insoluble in an aqueous alkali developer but becomes soluble prior to development, a photoacid generator which produces a strong acid upon irradiation and a photobleachable dye. The invention further provides for a process for imaging the photoresist of the present invention, especially where the thickness of the photoresist is up to 200 microns and where the process comprises a single exposure step.

17 Claims, 1 Drawing Sheet

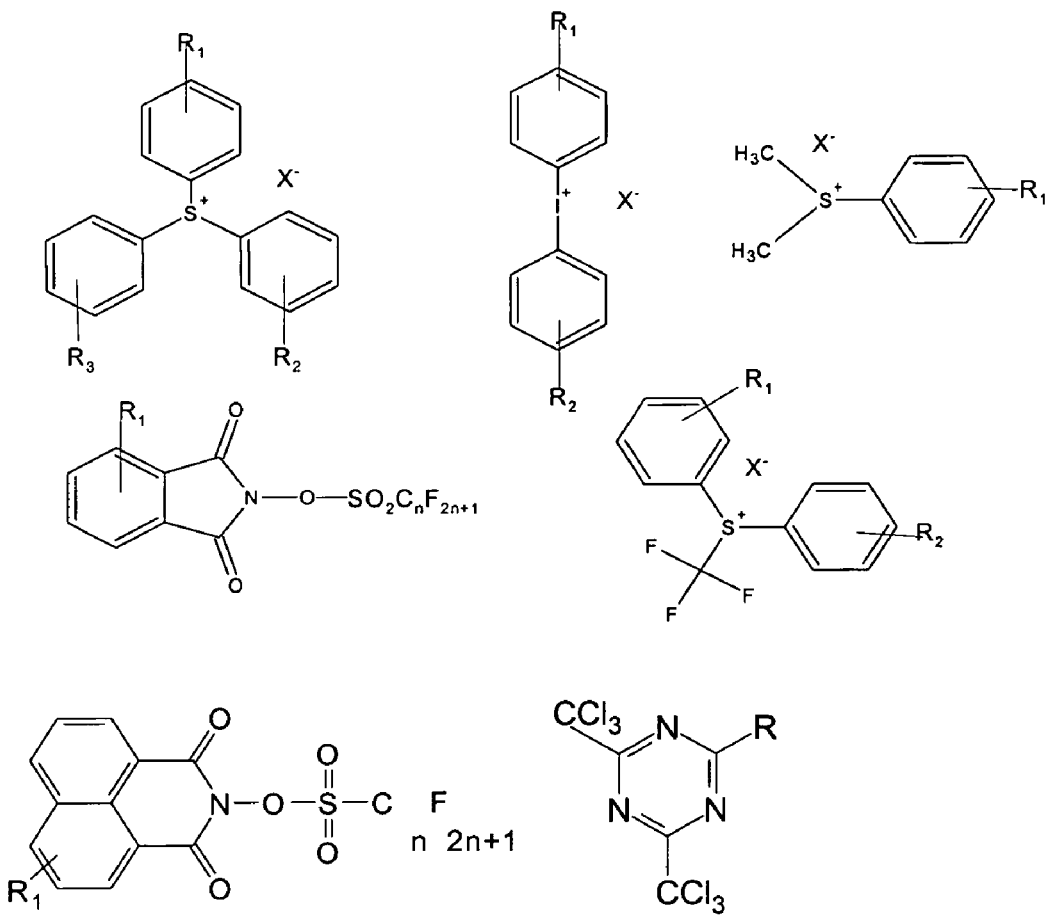
Figure 1: Examples of Photoactive Compounds
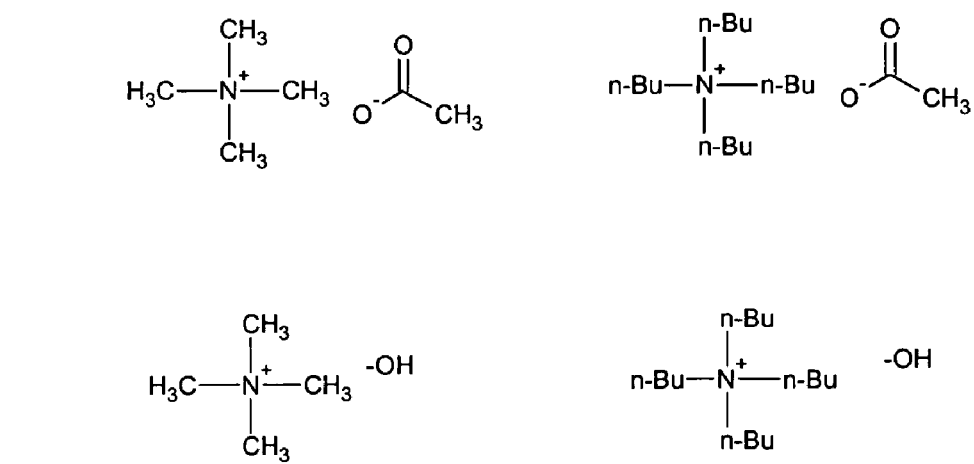
Figure 2: Examples of suitable ammonium bases

PHOTORESIST COMPOSITION FOR IMAGING THICK FILMS

FIELD OF INVENTION

The present invention relates to a light-sensitive photoresist composition especially useful for imaging thick films, comprising a film-forming alkali-insoluble resin, a photoacid generator which produces a strong acid, a solvent and a photobleachable dye which is absorbing at the same radiation as the photoacid generator and has preferably a similar or lower rate of photobleaching than the photoacid generator. Preferably the photoresist film has a thickness greater than 2 microns. The invention further provides for a process for coating and imaging the light-sensitive composition of this invention.

BACKGROUND OF THE INVENTION

Photoresist compositions are used in microlithography processes for making miniaturized electronic components such as in the fabrication of computer chips and integrated circuits. Generally, in these processes, a coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble in such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution, plasma gases, or have metal or metal composites deposited in the spaces of the substrate where the photoresist coating was removed during development. The areas of the substrate where the photoresist coating still remains are protected. Later, the remaining areas of the photoresist coating may be removed during a stripping operation, leaving a patterned substrate surface. In some instances, it is desirable to heat treat the remaining photoresist layer, after the development step and before the etching step, to increase its adhesion to the underlying substrate.

In the manufacture of patterned structures, such as wafer level packaging, electrochemical deposition of electrical interconnects has been used as the density of the interconnects increases. For example, see Solomon, Electrochemically Deposited Solder Bumps for Wafer-Level Packaging, Packaging/Assembly, Solid State Technology. Gold bumps, copper posts and copper wires for redistribution in wafer level packaging require a resist mold that is later electroplated to form the final metal structures in advanced interconnect technologies. The resist layers are very thick compared to the photoresists used in the IC manufacturing of critical layers. Both feature size and resist thickness are typically in the range of 2 µm to 100 µm, so that high aspect ratios (resist thickness to line size) have to be patterned in the photoresist.

Devices manufactured for use as microelectromechanical machines also use very thick photoresist films to define the components of the machine.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. Novolaks may also be reacted with quinone diazides and combined with a polymer. It has been found that photoresists based on only novolak/diazide do not have the photosensitivity or the steepness of sidewalls necessary for certain type of processes, especially for very thick films.

It is the object of the present invention to provide a chemically amplified photoresist useful for imaging films as thick as 200 microns, which provides good lithographic properties, particularly photosensitivity, high aspect ratio, vertical sidewalls, improved adhesion on metal and silicon substrates, compatibility with electroplating solutions and process, reduced resist film cracking and improved environmental stability. The inventors of the present invention have found that a photoresist comprising a polymer which is insoluble in an aqueous alkali developer but becomes soluble prior to development, a photoacid generator which produces a strong acid upon irradiation and a photobleachable dye which is absorbing at the same radiation wavelength(s) as the photoacid generator and preferably, has a similar or lower rate of photobleaching compared to the photoacid generator, provides the desired lithographic properties when imaged, especially for thick films up to 200 microns.

BRIEF DESCRIPTION OF DRAWINGS

FIG. 1 shows examples of photoactive compounds.

FIG. 2 describes examples of suitable ammonium bases.

SUMMARY

The invention relates to a photoresist composition comprising a polymer which is insoluble in an aqueous alkali developer but becomes soluble prior to development, a photoacid generator which produces a strong acid upon irradiation and a photobleachable dye which is absorbing at the same irradiation as the photoacid generator. Preferably the photobleachable dye has a similar or a lower rate of photobleaching than the photoacid generator. The invention also relates to a process for imaging such a photoresist composition.

DESCRIPTION OF THE INVENTION

The novel photoresist of the present invention provides for a light-sensitive photoresist composition useful for imaging thick films, comprising a polymer which is insoluble in an aqueous alkali developer but becomes soluble prior to development, a photoacid generator which produces a strong acid upon irradiation and a photobleachable dye. The photobleachable dye and the photoacid generator absorb the same radiation, which is the radiation used to expose the photoresist. Further, the bleachable dye has approximately similar or lower rate of photobleaching than the rate of photolysis of the photoacid generator. The rate of bleaching of the dye is preferably not significantly higher than the photolysis of the photoacid generator. Preferably no more than 95% dye bleaching should occur at the resist dose to clear. The clearing dose of the resist is defined as the minimum exposure dose required for completely developing the full resist thickness using given process conditions. The invention further provides for a process for imaging the photoresist of the present invention, especially where the thickness of the photoresist is greater than 2 microns and where the process comprises a single exposure step. Photoresist films as thick as 200 microns may be imaged. The photoresist is particularly useful for imaging photoresist films on copper substrates requiring an aspect ratio of greater than 3 (aspect ratio is the ratio of height to width of the photoresist pattern).

The polymer of the photoresist composition of the present invention is insoluble in an aqueous alkali developer but becomes soluble prior to development. Typically the polymer is an aqueous alkali soluble polymer which is protected by an acid labile group. Alkali soluble polymers can be homopolymers or copolymers comprising units derived from monomers comprising a hydroxy groups or an ester group. Preferred, are polymers comprising phenolic groups, such as comprising the hydroxystyrene monomer. The phenolic groups are blocked with an acid labile group, such as esters and/or acetals, tert-butoxycarbonyl or alkyloxycarbonylalkyl (such as (tert-butoxycarbonyl)methyl). Also preferred are (alkyl)acrylates which may be copolymerized to provide an acid labile ester group, examples of which are tert-butyl acrylate, tert-butyl methacrylate and methyladamantyl acrylate. Preferred are copolymers of hydroxystyrene and acrylates. The polymers may further comprise comonomeric units which do not have acid labile groups and are derived from polymerizable monomers, for example, styrene, acetoxystyrene, and methoxystyrene.

Examples of hydroxystyrene based resins usable for capping with acid labile groups include: poly-(4-hydroxystyrene); poly-(3-hydroxystyrene); poly-(2-hydroxystyrene); and copolymers of 4-, 3-, or 2-hydroxystyrene with other monomers, particularly bipolymers and terpolymers. Examples of other monomers usable herein include 4-, 3-, or 2-acetoxystyrene, 4-, 3-, or 2-alkoxystyrene, styrene, α-methylstyrene, 4-, 3-, or 2-alkylstyrene, 3-alkyl-4-hydroxystyrene, 3,5-dialkyl-4-hydroxystyrene, 4-, 3-, or 2-chlorostyrene, 3-chloro-4-hydroxystyrene, 3,5-dichloro-4-hydroxystyrene, 3-bromo-4-hydroxystyrene, 3,5-dibromo-4-hydroxystyrene, vinylbenzyl chloride, 2-vinylnaphthalene, vinylanthracene, vinylaniline, vinylbenzoic acid, vinylbenzoic acid esters, N-vinylpyrrolidone, 1-vinylimidazole, 4-, or 2-vinylpyridine, 1-vinyl-2-pyrrolidinone, N-vinyl lactam, 9-vinylcarbazole, vinyl benzoate, acrylic acid and its derivatives, i.e. methyl acrylate and its derivatives, acrylamide and its derivatives, methacrylic acid and its derivatives, i.e. methyl methacrylate and its derivatives, methacrylamide and its derivatives, acrylonitrile, methacrylonitrile, 4-vinyl benzoic acid and its derivatives, i.e. 4-vinyl benzoic acid esters, 4-vinylphenoxy acetic acid and its derivatives, i.e. 4-vinylphenoxy acetic acid esters, maleimide and its derivatives, N-hydroxymaleimide and its derivatives, maleic anhydride, maleic/fumaric acid and their derivatives, i.e. maleic/fumaric acid ester, vinyltrimethylsilane, vinyltrimethoxysilane, or vinyl-norbornene and its derivatives. Another examples of preferred other monomers usable herein include isopropenylphenol, propenylphenol, poly-(4-hydroxyphenyl)(meth)acrylate, poly-(3-hydroxyphenyl)(meth)acrylate, poly-(2-hydroxyphenyl)(meth)acrylate, N-(4-hydroxyphenyl)(meth)acrylamide, N-(3-hydroxyphenyl)(meth)acrylamide, N-(2-hydroxyphenyl)(meth)acrylamide, N-(4-hydroxybenzyl)(meth)acrylamide, N-(3-hydroxybenzyl)(meth)acrylamide, N-(2-hydroxybenzyl)(meth)acrylamide, 3-(2-hydroxy-hexafluoropropyl-2)-styrene, and 4-(2-hydroxy-hexafluoropropyl-2)-styrene.

As described above, for the photoresist of the present invention, the hydroxystyrene based resin is made alkali insoluble by protecting alkali soluble groups on the resin with an acid cleavable protective group. The introduction of the protective group may be carried out by any proper method depending upon alkali soluble groups on the resin, and could be easily carried out by a person having ordinary skill in the art.

For example, when the alkali soluble group on the resin is a phenolic hydroxy group, the phenolic hydroxy groups present in the resin are partly or fully protected by any known acid labile protective group, preferably by one or more protective groups which form acid cleavable C(O)OC, C—O—C or C—O—Si bonds. Examples of protective groups usable herein include acetal or ketal groups formed from alkyl or cycloalkyl vinyl ethers, silyl ethers formed from suitable trimethylsilyl or t-butyl(dimethyl)silyl precursors, alkyl ethers formed from methoxymethyl, methoxyethoxymethyl, cyclopropylmethyl, cyclohexyl, t-butyl, amyl, 4-methoxybenzyl, o-nitrobenzyl, or 9-anthrylmethyl precursors, t-butyl carbonates formed from t-butoxycarbonyl precursors, and carboxylates formed from t-butyl acetate precursors. Also useful are groups such as (tert-butoxycarbonyl)methyl and its ($C_1$-$C_6$) alkyl analogs.

When the alkali soluble group on the resin is a carboxyl group, the carboxyl groups present on the resin are partly or fully protected by an acid labile protective group, preferably by one or more protective groups which form acid cleavable C—O—C or C—O—Si bonds. Examples of protective groups usable herein include alkyl or cycloalkyl vinyl ethers and esters formed from precursors containing methyl, methyloxymethyl, methoxyethoxymethyl, benzyloxymethyl, phenacyl, N-phthalimidomethyl, methylthiomethyl, t-butyl, amyl, cyclopentyl, 1-methylcyclopentyl, cyclohexyl, 1-methylcyclohexyl, 2-oxocyclohexyl, mevalonyl, diphenylmethyl, α-methylbenzyl, o-nitrobenzyl, p-methoxybenzyl, 2,6-dimethoxybenzyl, piperonyl, anthrylmethyl, triphenylmethyl, 2-methyladamantyl, tetrahydropyranyl, tetrahydrofuranyl, 2-alkyl-1,3-oxazolinyl, trimethylsilyl, or t-butyldimethylsilyl group.

According to the present invention, the above resins may be used alone or as a mixture of two or more.

Particularly preferred are polymers comprising units derived from at least one monomer selected from substituted hydroxystyrene, unsubstituted hydroxystyrene, substituted alkyl acrylates, unsubstituted acrylates. The acrylates may contain acid labile groups or nonacid labile groups. The polymer may further comprise units which do not have an acid labile group, such as those derived from monomers based on substituted or unsubstituted styrene, ethylene with pendant groups such as cyclo($C_5$-$C_{10}$)alky, adamantly, phenyl, carboxylic acid, etc.

The alkali insoluble polymer of the present invention has a weight average molecular weight ranging from about 2,000 to about 100,000, preferably from about 3,000 to about 50,000, and more preferably from about 5,000 to about 30,000. The polymer is present in the formulation at levels ranging from about 20 to about 99 weight %, preferably from about 85 to about 98 weight % by total solids of the photoresist.

Although any photoactive compound may be used in the photoresist, commonly a compound capable of producing a strong acid upon irradiation, a photoacid generator (PAG), of the novel composition is selected from those which absorb at the desired exposure wavelength, preferably below 370 nm, and more preferably 365 nm. The photogenerated acid deprotects the alkali insoluble polymer of the photoresist to give a polymer which is now soluble in the alkaline developer in the exposed regions. Any PAG may be used which generates a strong acid, particulary a sulfonic acid. Suitable examples of acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, nitrobenzyl sulfonate esters, and imidosulfonates, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluromethane sulfonate, triphenylsulfonium nonafluorobutane sulfonate and the like. Other useful onium salts such as those disclosed in U.S. patent applications with Ser. No. 10/439,472—filed May 16, 2003, Ser. No. 10/609, 735—filed Jun. 30, 2003, Ser. No. 10/439,753 filed May 16, 2003, and Ser. No. 10/863,042—filed Jun. 8, 2004, and are incorporated herein by reference. Other compounds that form an acid upon irradiation that may be used are triazines, oxazoles, oxadiazoles, thiazoles, substituted 2-pyrones. PAGS such as those described in US2002/0061464 are also useful. Phenolic sulfonic esters, trichloromethyltriazines, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl) methide, diphenyliodonium bis(trifluoromethylsulfonyl) imide, N-hydroxynaphthalimide triflate, and their homologues are also possible candidates. FIG. 1 shows some examples of photoactive compounds, where $R_1$-$R_3$ are independently ($C_1$-$C_8$)alkyl or ($C_1$-$C_8$)alkoxy substituents, $X^-$ is a sulfonate counterion, n=1-20, and R is independently selected from ($C_1$-$C_8$)alkyl, ($C_1$-$C_8$)alkoxy, phenyl, styrylphenyl, ($C_1$-$C_8$)alkoxy-styrylphenyl, furylethylidene, ($C_1$-$C_8$)alkyl substituted furylethylidene, naphthyl, ($C_1$-$C_8$) alkyl or ($C_1$-$C_8$)alkoxy substituted naphthyl. Mixtures of photoactive compounds may also be used. In one preferred embodiment iodonium salts and sulfonium salts as photoactive compounds are preferred, and sulfonium salts as photoactive compounds are more preferred. In another embodiment of the PAG, the PAG is a mixture of a triazine and an imide. The photoactive compound, preferably a photoacid generator, may be incorporated in a range from 0.1 to 10 weight % by solids, preferably from 0.3 to 5 weight % by solids, and more preferably 0.5 to 2.5 weight % by solids. More types of PAGS useful in this invention are trichloromethyltriazines, especially when used in mixtures with other PAGs, such as naphthalimides.

The photoresist composition of the present invention comprises an alkali insoluble polymer, a photoacid generator and a photobleachable dye. The photobleachable dye preferably is one which is absorbing at the same radiation as the photoacid generator and more preferably has a similar or lower rate of photobleaching. It has been found that vertical sidewalls of a photoresist pattern can be obtained by adjusting the type of bleachable dye and its concentration. Preferably the bleachable dye is a diazonaphthoquinone sulfonate ester of a polyhydroxy compound or monohydroxy phenolic compound, which can be prepared by esterification of 1,2-napthoquinonediazide-5-sulfonyl chloride and/or 1,2-naphthoquinonediazide-4-sulfonyl chloride with a phenolic compound or a polyhydroxy compound having 2-7 phenolic moieties, and in the presence of basic catalyst. Diazonaphthoquinones as photoactive compounds and their synthesis are well known to the skilled artisan. These compounds, which comprise a component of the present invention, are preferably substituted diazonaphthoquinone dyes, which are conventionally used in the art in positive photoresist formulations. Such sensitizing compounds are disclosed, for example, in U.S. Pat. Nos. 2,797,213, 3,106,465, 3,148,983, 3,130,047, 3,201,329, 3,785,825 and 3,802,885. Useful photobleachable dyes include, but are not limited to, the sulfonic acid esters made by condensing phenolic compounds such as hydroxy benzophenones, oligomeric phenols, phenols and their derivatives, novolaks and multisubstituted-multihydroxyphenyl alkanes with naphthoquinone-(1,2)-diazide-5-sulfonyl chloride and/or naphtho-quinone-(1,2)-diazide-4-sulfonyl chlorides. In one embodiment of the bleachable dye, monohydroxy phenols such as cumylphenol are preferred. In another embodiment of the bleachable dye, the number of the phenolic moieties per one molecule of the polyhydroxy compound used as a backbone of bleachable dye is in the range of 2-7, and more preferably in the range of 3-5.

Some representative examples of polyhydroxy compounds are:

(a) Polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2'4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, and 2,3,4,3',4', 5'-hexahydroxybenzophenone;

(b) Polyhydroxyphenylalkylketones such as 2,3,4-trihydroxyacetophenone, 2,3,4-trihydroxyphenylpentylketone, and 2,3,4-trihydroxyphenylhexylketone;

(c) Bis(polyhydroxyphenyl)alkanes such as bis(2,3,4-trihydroxyphenyl)methane, bis(2,4-dihydroxyphenyl)methane, and bis(2,3,4-trihydroxyphenyl)propane;

(d) Polyhydroxybenzoates such as propyl 3,4,5-trihydroxybenzoate, phenyl 2,3,4-trihydroxybenzoate, and phenyl 3,4,5-trihydroxybenzoate;

(e) Bis(polyhydroxybenzoyl)alkanes or bis(polyhydroxybenzoyl)aryls such as bis(2,3,4-trihydroxybenzoyl)methane, bis(3-acetyl-4,5,6-trihydroxyphenyl)methane, bis(2,3,4-trihydroxybenzoyl)benzene, and bis(2,4,6-trihydroxybenzoyl)benzene;

(f) Alkylene di(polyhydroxybenzoates) such as ethyleneglycol-di(3,5-dihydroxybenzoate) and ethylene glycoldi(3,4,5-trihydroxybenzoate);

(g) Polyhydroxybiphenyls such as 2,3,4-biphenyltriol, 3,4,5-biphenyltriol, 3,5,3'5'-biphenyltetrol, 2,4,2',4'-biphenyltetrol, 2,4,6,3',5'-biphenylpentol, 2,4,6,2',4',6'-biphenylhexol, and 2,3,4,2',3',4'-biphenylhexol;

(h) Bis(polyhydroxy)sulfides such as 4,4'-thiobis(1,3-dihydroxy)benzene;

(i) Bis(polyhydroxyphenyl)ethers such as 2,2'4,4'-tetrahydroxydiphenyl ether;

(j) Bis(polyhydroxyphenyl)sulfoxides such as 2,2'4,4'-tetrahydroxydiphenylsulfoxide;

(k) Bis(polyhydroxyphenyl)sulfones such as 2,2',4,4'-tetrahydroxydiphenylsulfone;

(l) Polyhydroxytriphenylmethanes such as tris(4-hydroxyphenyl)methane, 4,4',4"-trihydroxy-3,5,3',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenyl methane, 2,3,4,2',3',4'-hexahydroxy-5,5'-diacetyltriphenylmethane, 2,3,4,2',3',4',3",4"-octahydroxy-5,5-diacetyltriphenylmethane, and 2,4,6,2',4',6'-hexahydroxy-5,5'-dipropionyltriphenylmethane;

(m) Polyhydroxy-spirobi-indanes such as 3,3,3',3'-tetramethyl-1,1'-spirobi-indane-5,6,5',6'-tetrol, 3,3,3'3'-tetramethyl-1,1'-spirobi-indane-5,6,7,6'6',7'-hexol, and 3,3,3'3'-tetramethyl-1,1'-spirobi-indane-4,5,6,4',5',6'-hexol;

(n) Polyhydroxyphthalides such as 3,3-bis(3,4-dihydroxyphenyl)phthalide, 3,3-bis(2,3,4-trihydroxyphenyl)phthalide, and 3',4',5',6'-tetrahydroxyspiro(phthalide-3,9'-xanthene);

(o) Polyhydroxy compounds described in JP No. 4-253058 such as alpha,alpha'alpha"-tris(4-hydroxyphenyl)-1,3,5-triisopropylbenzene,alpha,alpha',alpha"-tris(3,5-dimethyl-4-hydroxyphenyl)-1,3,5-triisopropylbenzene,alpha,alpha',alpha"-tris(3,5-diethyl-4-hydroxyphenyl)-1,3,5-triisopropylbenzene,alpha,alpha',alpha"-tris(3,5-di-n-propyl-4-hydroxyphenyl)-1,3,5-tri-isopropylbenzene, alpha,alpha',alpha"-tris(3,5-diisopropyl-4-hydroxyphenyl)-1,3,5-triisopropylbenzene,alpha,alpha', alpha"-tris(3,5-di-n-butyl-4-hydroxyphenyl)-1,3,5-triisopropylbenzene,alpha,alpha',alpha"-tris(3-methyl-4-hydroxyphenyl)-1,3,5-triisopropyl-benzene,alpha,alpha', alpha"-tris(3-methoxy-4-hydroxyphenyl)-1,3,5-triisopropylbenzene,alpha,alpha',alpha"-tris(2,4-dihydroxyphenyl)-1,3,5-triisopropylbenzene, 2,4,6-tris(3,5-dimethyl-4-hydroxyphenylthiomethyl)mesitylene, 1-[alpha-methyl-alpha-(4"-hydroxyphenyl)ethyl]-4-[alpha,alpha'-bis(4"-hydroxyphenyl)ethyl]benzene, 1-[alpha-methyl-alpha-(4'-hydroxyphenyl)ethyl]-3-[alpha,alpha'-bis(4"-hydroxyphenyl)ethyl]benzene, 1-[alpha-methyl-alpha-(3',5'-dimethyl-4'-hydroxyphenyl)ethyl] benzene, 1-[alpha-methyl-alpha-(3'-methoxy-4'-hydroxyphenyl)ethyl]-4-[alpha',alpha'-bis(3'-methoxy-4'-hydroxyphenyl)ethyl]benzene, and 1-[alpha-methyl-alpha-(2',4'-dihydroxyphenyl)ethyl]-4-[alphal,alpha'-bis (4'-hydroxyphenyl)ethyl]benzene.

Other examples of naphthoquinonediazide photoactive compounds include condensation products of novolak resins with a naphthoquinonediazide sulfonyl chloride. These condensation products (also called capped novolaks) may be used instead of o-quinonediazide esters of polyhydroxy compounds or used in combination therewith. Numerous U.S. patents describe such capped novolaks, U.S. Pat. No. 5,225,311 is one such example. Mixtures of various naphthoquinone-diazide compounds may also be used. The bleachable dye may be present in the novel photoresist composition at levels up to 15 weight % of total solids, preferably ranging from about 0.1% to about 10% of total solids, more preferably from about 0.30 to about 5% of total solids, and even more preferably from about 0.35% to about 2.5% of total solids.

The photoresist of the present invention comprises the alkali insoluble polymer, a photoacid generator, a photobleachable dye, and optionally a base additive. In some cases bases or photoactive bases are added to the photoresist to control the profiles of the imaged photoresist and prevent surface inhibition effects, such as T-tops. Bases may be added at levels from about 0.01 weight % to about 5 weight % of solids, preferably up to 1 weight % of solids, and more preferably to 0.07 weight % of solids. Nitrogen containing bases are preferred, specific examples of which are amines, such as triethylamine, triethanolamine, aniline, ethylenediamine, pyridine, tetraalkylammonium hydroxide or its salts. Examples of photosensitive bases are diphenyliodonium hydroxide, dialkyliodonium hydroxide, trialkylsulfonium hydroxide, etc. The base may be added at levels up to 100 mole % relative to the photoacid generator. Although, the term base additive is employed, other mechanisms for removal of acid are possible, for instance by using tetraalkylammonium salts of volatile acids (eg. $CF_3CO_2^-$) or nucleophilic acids (eg $Br^-$), which respectively remove acid by volatilization out of the film during post-exposure bake or by reaction of a nucleophilic moiety with the acid precursor carbocation (e.g. reaction of tert-butyl carbocation with bromide to form t-butylbromide).

FIG. 2 shows the structures of ammonium derivatives which might be employed as bases.

The use of non volatile amine additives is also possible. Preferred amines would be ones having a sterically hindered structure so as to hinder nucleophilic reactivity while maintaining basicity, low volatility and solubility in the resist formulation, such as a proton sponge, 1,5-diazabicyclo [4.3.0]-5-nonene, 1,8-diazabicyclo[5,4,0]-7-undecene, cyclic akylamines, or polyether bearing amines such as described in U.S. Pat. No. 6,274,286.

The photoresist of the present invention may contain other components such as additives, surfactants, dyes, plasticizers, and other secondary polymers. Surfactants are typically compounds/polymers containing fluorine or silicon compounds which can assist in forming good uniform photoresist coatings. Certain types of dyes may be used to provide absorption of unwanted light. Plasticizers may be used, especially for thick films, to assist in flow properties of the film, such as those containing sulfur or oxygen. Examples of plastisizers are adipates, sebacates and phthalates. Surfactants and/or plasticizers may be added at concentrations ranging from 0.1 to about 10 weight % by total weight of solids in the photoresist composition. Secondary polymers may be added to the composition of the present invention, especially preferred are novolak resins, which can be prepared from polymerization of phenol, cresols, di- and trimethy-substituted-phenols, polyhydroxybenzenes, naphthols, polyhydroxynaphthols and other alkyl-substituted-polyhydroxyphenols and formaldehyde, acetaldehyde or benzaldehyde. Secondary polymers may be added at levels ranging from about 0% to about 70% of total solids, preferably from about 5% to about 60% of total solids preferably from about 10% to about 40% of total solids.

In producing the photoresist composition, the solid components of the photoresist are mixed with a solvent or mixtures of solvents that dissolve the solid components of the photoresist. Suitable solvents for photoresists may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methylpyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The prepared photoresist composition solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include, without limitation, silicon, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds.

The photoresist coatings produced by the described procedure are particularly suitable for application to copper coated wafers, such as are utilized in the production of microprocessors and other miniaturized integrated circuit components. A silicon/silicon dioxide wafer can also be used. The substrate may also comprise various polymeric resins, especially antireflective coatings. The substrate may have an adhesion promoted layer of a suitable composition, such as one containing hexa-alkyl disilazane.

The photoresist composition solution is then coated onto the substrate, and the substrate is treated at a temperature from about 70° C. to about 150° C. for from about 30 seconds to about 6 minutes on a hot plate or for from about 15 to about 90 minutes in a convection oven. This temperature treatment is selected in order to reduce the concentration of residual solvents in the photoresist, while not causing substantial thermal degradation of the photoabsorbing compounds. In general, one desires to minimize the concentration of solvents and this first temperature treatment is conducted until substantially all of the solvents have evaporated and a coating of photoresist composition, on the order of 2-200 microns (micrometer) in thickness, remains on the substrate. Multiple coatings may be done to achieve thick films. In a preferred embodiment the temperature is from about 95° C. to about 135° C. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm (nanometers) to about 450 nm, x-ray, electron beam, ion beam or laser radiation, in any desired pattern, produced by use of suitable masks, negatives, stencils, templates, etc. Generally, thick photoresist films are exposed using broadband radiation, using equipments such as Ultratech, Karl Süss or Perkin Elmer broadband exposure tools, although 436 nm and 365 nm Steppers may also be used.

The photoresist is then optionally subjected to a post exposure second baking or heat treatment either before or after development. The heating temperatures may range from about 90° C. to about 150° C., more preferably from about 90° C. to about 130° C. The heating may be conducted for from about 30 seconds to about 3 minutes, more preferably from about 60 seconds to about 2 minutes on a hot plate or about 30 to about 45 minutes by convection oven.

The exposed photoresist-coated substrates are developed to remove the image-wise exposed areas by immersion in a developing solution or developed by spray development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One preferred hydroxide is tetramethyl ammonium hydroxide. Other preferred bases are sodium or potassium hydroxide. Additives, such as surfactants, may be added to the developer. After removal of the coated wafers from the developing solution, one may conduct an optional post-development heat treatment or bake to increase the coating's adhesion and density of the photoresist. The imaged substrate may then be coated with metals, or layers of metals to form bumps as is well known in the art, or processed further as desired.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Examples 1-13

The photoresist samples 1-13 were formulated as shown in Table 1. The photoresist samples were then microfiltered through a fine pore size filter selected from 0.2 μm to 10 μm, depending on the photoresist viscosity.

The photoresist samples were then evaluated for their lithographic properties. Each sample was spin coated separately on a silicon wafer and on a copper substrate at an appropriate spin speed. The coated substrates were soft baked at 110° C. for at least 120 minutes for 10 microns thick films. Thicker films (40-50 μm) required multiple bakes at 110° C. for up to 7 minutes. The exposure tools used were ASML i-line stepper for 10 micron films and for greater than 10 micron films, proximity, Suss MA-200 aligner. The substrates were post exposure baked at 110° C. for 30 minutes. The substrates with 10 micron photoresist film were developed for 60 minutes using puddle development with AZ 300MIF developer (available from AZ Electronic Materials USA Corp.) at 23° C. The substrates with 40 micron photoresist film were developed 4 times using puddle development with AZ® 300MIF developer (available from AZ® Electronic Materials, Somerville, USA Corps.) for 60 minutes at 23° C. The photoresist profiles were examined with scanning electron microscope to evaluate the photoresist sidewall profiles, resolution and clearing of the substrate.

The results are given in Table 1.

The performance of the photoresist was compared for formulations containing no dye, dye or bleachable dye. Two types of substrates were used, silicon (Si) and copper (Cu), and two film thicknesses were examined, 10 μm and 40 μm.

In all the Cu substrate cases, the addition of a bleachable dye to the photoresist gave improved performances, in terms of profile with steep sidewalls and good resolution, as observed in examples (7-13). The comparative examples (1 and 5) showed poor resolution and curved or sloping sidewalls for the photoresist pattern. Example 6 showed that the photoresist did not have the optimum concentration of the bleachable dye for a 40 micron thick film. Examples 2 and 3 did not give both good resolution and vertical profiles.

When the substrate was silicon, the bleachable dye provided good performances in all cases (examples 6-13).

The bleachable dye had the greater beneficial impact on the copper substrate than the silicon substrate.

TABLE 1

Formulation and Results

| | Polymers | | PAGs | | | Bleachable | Lutonal | Solvents PGMEA/ | % | Film Thick- | Perofile on Si | Performance on Cu |
|---|---|---|---|---|---|---|---|---|---|---|---|---|
| Ex. | GIJ | Novolak | (1) (2) | Base | Dye | Dye | M 40 | cyclohexanone | Solids | ness | wafers | wafers |
| 1 | 16.48 | 7.06 | 0.33 | — | — | — | 0.328 | 26.094 | — | 47.8 | 10 um and 40 um | Inverted profiles | Poor resolution, concaved profiles and loss of small lines: 10 um and below |
| 2 | 13.516 | 5.792 | 0.0596 | — | 0.0958 | — | 0.536 | 30 | — | 40.0 | 10 um | Vertical profiles | Poor resolution, residual resist between lines |
| 3 | 13.827 | 5.926 | 0.0272 | — | 0.0998 | — | — | 30.12 | — | 39.76 | 40 um | Sloped profiles | Poor resolution and residual resist all over the wafer |
| 4 | 16.411 | 7.033 | 0.0327 | — | 0.023 | — | — | 26.5 | — | 47 | 40 um | Vertical profiles | Poor resolution, severe foot and residue |
| 5 | 24.565 | — | 0.174 | — | — | — | 1.306 Polyglycol, | 20.08 | 3.872 | 52.09 | 52 um | Vertical profiles | Poor resolution: (30 um) 1.7 aspect ratio |
| 6 | 25.332 | — | 0.1914 | 0.03 | — | 0.0832$^{(2)}$ | 0.408 | 21.364 | 5.341 | 46.59 | 40 um | Vertical profiles | Poor resolution: (20 um) 2.0 aspect ratio |
| 7 | 14.919 | 6.3938 | 0.1619 | 0.029 | — | 0.1425$^{(2)}$ | 0.3455 | 22.4 | 5.6015 | 43.985 | 33 um | Vertical profiles | Good resolution: (10 um) Aspect ratio >3 |
| 8 | 18.8873 | — | 0.1548 | 0.024 | — | 0.2694$^{(2)}$ | 0.3049 | 24.2856 | 6.0714 | 39.286 | 40 um | Vertical profiles | Good resolution: (10 um) Aspect ratio >3 |
| 9 | 16.1128 | 6.905 | 0.1713 | 0.0304 | — | 0.1496$^{(1)}$ | — | 21.304 | 5.326 | 46.74 | 10 um and 40 um | Steep profiles | Steep profiles with good resolution: 10 um in 40 um films Aspect ratio >3 4 um in 10 um films |
| 10 | 19.043 | — | 0.1692 | 0.0318 | — | 0.1227$^{(1)}$ | 0.2881 | 24.276 | 6.069 | 39.31 | 10 um | Steep profiles | Steep profiles with good resolution: (3 um) Aspect ratio >3 |
| 11 | 19.0508 | — | 0.1693 | 0.0117 | — | 0.1228$^{(1)}$ | 0.2883 | 24.286 | 6.0714 | 39.286 | 10 um | Steep profiles | Concaved profiles with resolution: (4.2 um) |
| 12 | 19.0465 | — | 0.16917 | 0.02176 | — | 0.1227$^{(1)}$ | 0.2883 | 24.281 | 6.0703 | 39.297 | 10 um | Steep profiles | Steep profiles with good resolution: (3.2 um) |
| 13 | 13.521 | 5.795 | 0.1648 0.1849$^{(2)}$ | 0.1407 | — | 0.0724$^{(2)}$ | 0.3477 | 23.92 | 5.98 | 40.2 | 10 um | Steep profiles | Steep profiles with good resolution: (2.2 um) |

Polymer: GIJ polymer is a ter-polymer of hydroxystyrene, styrene and tertiary-butylacrylate (available from Dupont Electronic Technologies, Ingleside, Texas.)
PAGs: (1) N-hydroxynaphthalimide triflate, (2) 2-{2'-(5'-methylfuryl) ethylidene}-4,6-bis (trichloromethyl)-S-triazine
Dye: 2,2',4,4'-tetrahydroxybenzophenone
Bleachable dye:
$^{(1)}$Di-ester of 2,3,4-trihydroxybenzophenone and a mixture of 2,1,4 and 2,1,5-diazonaphthoquinonesulfonylchloride
$^{(2)}$80% ester of tetrahydroxybenzophenone with 2,1,5-diazonaphthoquinonesulfonylchloride Up to 1 w % surfactant, APS-437 (available from D.H. Litter Co., 565, Taxter Rd., Elmsford, New York) was added to the solution.

The invention claimed is:

1. A photoresist composition comprising a polymer which is insoluble in an aqueous alkali developer but becomes soluble prior to development, a photoacid generator which produces a strong acid upon irradiation and a photobleachable dye which is absorbing at the same radiation as the photoacid generator, further where the photoacid generator is an imide and the photobleachable dye is a naphthoquinone diazide.

2. The photoresist according to claim 1, where the photobleachable dye has a similar or lower rate of photobleaching than the photoacid generator.

3. The photoresist according to claim 1, where the polymer is an aqueous alkali soluble polymer protected with an acid labile group.

4. The photoresist according to claim 1, where the polymer comprises at least one unit derived from monomers selected from hydroxy styrene, acrylate capped with an acid labile group, methacrylate capped with acid labile group, hydroxy styrene capped with an acid labile group, styrene, acetoxystyrene, methoxystyrene, and mixtures thereof.

5. The photoresist according to claim 1, where the photoacid generator produces a sulfonic acid upon exposure.

6. The photoresist according to claim 1, where the photoacid generator is a sulfonyloxy imide or imidosulfonate.

7. The photoresist according to claim 1, where the photobleachable dye is 2,1,5, and/or 2,1,4, naphthoquinone diazide.

8. The photoresist according to claim 1, where the composition further comprises a novolak resin.

9. The photoresist according to claim 1, where the composition further comprises a base.

10. The photoresist according to claim 1, where the composition further comprises a plasiticizer.

11. A process for imaging a photoresist comprising the steps of:
    a) forming on a substrate a coating of a photoresist composition from claim 1;
    b) image-wise exposing the photoresist coating with radiation;
    c) postexposure baking the photoresist coating;
    d) developing the photoresist coating with an aqueous alkaline developer to form photoresist structures.

12. The process of claim 11, where the photoresist coating has a film thickness less than 200 microns.

13. The process of claim 11, where the photoresist coating is exposed in a single step.

14. The process of claim 11, where the photoresist is imaged with radiation from 300 nm to 450 nm.

15. The process of claim 11, where the photoresist structures have an aspect ratio of greater than 3.

16. The process of claim 11, where the developer is an aqueous solution of tetramethylammonium hydroxide.

17. The composition of claim 1, where the imide is a sulfonyloxyimide or imidosulfonate.

* * * * *